(12) United States Patent
Buckley

(10) Patent No.: US 7,055,702 B1
(45) Date of Patent: Jun. 6, 2006

(54) SLIP RESISTANT HORIZONTAL SEMICONDUCTOR WAFER BOAT

(75) Inventor: Richard F. Buckley, Shrewsbury, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 56 days.

(21) Appl. No.: 09/588,396

(22) Filed: Jun. 6, 2000

(51) Int. Cl.
*A47F 7/00* (2006.01)

(52) U.S. Cl. .................................................. 211/41.18

(58) Field of Classification Search .......... 211/41.18, 211/40; 206/454, 832; 118/500, 728
See application file for complete search history.

(56) References Cited

U.S. PATENT DOCUMENTS

| | | | | |
|---|---|---|---|---|
| 2,917,179 A | * | 12/1959 | Casey et al. | 211/40 |
| 3,527,353 A | * | 9/1970 | Farren | 211/40 |
| 3,623,615 A | * | 11/1971 | Kawachi | 211/40 |
| 3,834,349 A | * | 9/1974 | Dietze et al. | 118/500 |
| 4,023,691 A | | 5/1977 | Perel | 214/152 |
| 4,318,749 A | * | 3/1982 | Mayer | 134/25.4 |
| 4,653,636 A | | 3/1987 | Armstrong | 206/334 |
| 5,318,190 A | * | 6/1994 | Mason | 211/41 |
| 5,443,649 A | * | 8/1995 | Sibley | 118/728 |
| 5,538,230 A | * | 7/1996 | Sibley | 269/296 |
| 5,657,879 A | * | 8/1997 | Anderson et al. | 211/41.18 |
| 5,931,666 A | * | 8/1999 | Hengst | 432/258 |
| 6,001,180 A | * | 12/1999 | Inoue | 118/500 |
| 6,041,938 A | * | 3/2000 | Senn | 206/711 |
| 6,245,147 B1 | | 6/2001 | Kobayashi | |

FOREIGN PATENT DOCUMENTS

| | | |
|---|---|---|
| EP | 506052 A1 | 9/1992 |
| JP | 63-164312 | 7/1988 |
| JP | 1020615 A | 1/1989 |
| JP | 01130522 A | 5/1989 |
| JP | 01302814 | 12/1989 |
| JP | 04287915 | 10/1992 |
| JP | 05144756 | 6/1993 |
| JP | 06124911 A | 5/1994 |
| JP | 06333865 A | 12/1994 |
| JP | 07-273056 | 10/1995 |
| KR | 98-016043 | 5/1998 |

* cited by examiner

*Primary Examiner*—Jennifer E. Novosad
(74) *Attorney, Agent, or Firm*—Larson Newman Abel Polansky & White, LLP; Thomas G. Field, III

(57) ABSTRACT

A horizontal wafer boat for maintaining semiconductor wafers during wafer processing is disclosed. The wafer boat is configured to reduce the likelihood wafer slip when wafers are heated to processing temperatures of about 1000° C. and above.

9 Claims, 5 Drawing Sheets

SLIP RESISTANT HORIZONTAL SEMICONDUCTOR WAFER BOAT

FIELD OF THE INVENTION

The invention is in the field of equipment used in the processing and manufacturing of semiconductor wafers. More particularly, the present invention relates to an improved horizontal wafer boat.

BACKGROUND OF THE INVENTION

In the manufacture of semiconductors, silicon wafers are thermally processed. One method to process the wafers is to use horizontal furnace tubes. The wafers are processed to change their electrical properties and to build circuits. The temperatures for these processes range from 600 to nearly 1400° C.

The production of semiconductors is a very controlled process. As part of this process, furnace operations are performed on silicon wafers to build layers on the wafer and to dope materials into the wafer to change its electrical properties. Discrete dielectrics and pathways are formed to create capacitors and transistors. With precise configuration, a device is created.

Furnacing operations are generally classified into two categories, Atmospheric and Low Pressure Chemical Vapor Deposition (LPCVD). Atmospheric operations are used to anneal, to diffuse dopants into wafers, or to form oxide layers. These processes are typically performed at high temperatures, i.e., greater than about 900° C. Some atmospheric operations for high purity or for deep diffusion can reach temperatures of 1350° C.

LPCVD operations are used to build layers of polysilicon or silicon nitride onto the wafer. These operations take place under a partial vacuum, typically at lower temperatures in a range of between about 600° C. and 900° C.

A combination of the operations described above is used to construct a three dimensional device on the wafer. A simple device such as a power chip can have two layers while a complex logic circuit might have more than seven layers.

There are several different methods of furnacing wafers, referred to as horizontal, vertical, and Rapid Thermal Processing (RTP) methods. RTP is a single wafer process, whereas both vertical and horizontal furnacing are batch processes. More specifically, horizontal furnacing refers to a process in which many wafers are positioned on a wafer holder, or "boat", which is inserted into a horizontal furnace tube. Devices, such as wafer boats (also known as conti boats), which are subjected to furnace operations during semiconductor wafer processing are referred to herein as "furnaceware".

The material used to form the wafer boat must be resistant to high temperatures and not introduce impurities into the operation. When silicon wafers were first processed, the support fixtures were primarily made out of quartz. Quartz, however, suffers from several drawbacks when used in the production of wafer boats. In particular, at temperatures above about 1000° C., quartz tends to creep. After repeated furnace cycles, the quartz boats deform to an unacceptable degree. Wafer transfer operations are typically automated and it is critical to insert the wafer into a well defined feature of the furnaceware. If there is misalignment, the wafers may "crash" into the furnaceware contaminating the entire wafer load and often breaking. Broken wafers can introduce particles into the clean room environment and affect other processes as well.

Another drawback is particle generation. During LPCVD operations, a layer of deposited material, such as silicon nitride, is built up onto the surface of the wafer. The material that forms on the wafer during LPCVD operations, along with the wafer itself, have comparable thermal expansion rates such that a good mechanical and chemical bond exists. LPCVD deposits do not, however, adhere well to quartz because of mismatched thermal expansion coefficients which produce stress on the layers when the furnaceware is subjected to temperature changes. This stress causes the layers to flake and can introduce device-damaging particles into the system.

Chemical etching can also cause problems with quartz. Furnaceware is cleaned on a regular cycle to remove layers which have developed thereon. Typically, acid baths are used to remove these layers. Quartz can be chemically etched by the cleaning solutions used, and this can cause quartz furnaceware to lose strength and dimensional stability.

Many of the disadvantages known to exist in quartz furnaceware can be avoided by substituting other materials, such as silicon carbide (SiC) in the place of quartz. SiC has a thermal expansion coefficient similar to LPCVD depositions which form a mechanical and chemical bond to SiC. One useful replacement material is recrystallized SiC, available from Saint-Gobain Industrial Ceramics of Worcester, Mass., under the tradename CRYSTAR®. This material is a silicon carbide ceramic which has been impregnated with high purity silicon metal. Due to its robust mechanical properties through a wide range of temperatures and purity characteristics, CRYSTAR® ceramic has been shown to be an excellent alternative to quartz. CRYSTAR® may be used to support wafers during furnacing operations and can also serve as the furnace chamber.

As wafer sizes have increased, and as the size of features on the wafers has decreased, technological improvements in photolithograpy, inspection, furnacing, clean rooms and other areas have been required. Current production facilities for semiconductor devices employ wafers ranging in diameter from 100 mm to 200 mm. Currently, there is a desire to process wafers as large as 300 mm in diameter because such wafer sizes will allow more than twice as many chips or dies to be fabricated on each wafer. This is desirable because fine feature size devices require critical processing parameters, and there is a strong desire to reduce the number of wafers being processed and have a more tightly controlled production environment. Unfortunately, the shift to 300 mm wafers has been a slow process due to the large number of technical problems associated with the handling of large wafers.

Horizontal wafer manufacturing involves a series of thermal processing steps to build the device. Horizontal processing temperatures in excess of about 1000° C. for at least some of the manufacturing steps cannot be avoided. Due to the high temperatures and wafer stress, wafer slip can occur. A wafer is a single crystal disk. Wafer slip is the permanent plastic deformation of the wafer's crystal lattice. The transition temperature from brittle to ductile behavior of the wafer is about 720° C. Therefore, slip can occur at process temperatures above 720° C.

Wafer slip is important to the manufacturer because it has a negative impact on device performance. A device is made up of a series of gates which can switch states. These gates have precise features which must be maintained. If a slip plane occurs, the gates can become corrupted and fail to function properly. Even if the slip plane is small, device performance can be compromised because the dielectric properties have been changed. Typically, rather than investing more time in processing, a wafer with slip is scrapped.

Wafer slip creation is affected by several factors including temperature, gravitational stress, thermal stress, wafer type, wafer defects (edge chips, existing dislocations, oxygen content), and previous processing steps. As the thermal energy within the wafer increases, the energy required to induce slip decreases. Once the 720° C. ductile threshold is reached, slip lines can generate relatively easily. Shear stress, the dominant contributor, acts in plane and pushes the lattice so that it dislocates. Experimental and theoretical studies have analyzed the effects of temperature on allowable shear stress. Allowable shear stress is defined to be the maximum stress before the onset of slip.

Wafer mechanical stress and thermal differences are directly affected by the wafer boat. Accordingly a need exists for a wafer boat that minimizes these stresses with the resultant minimization of wafer slip.

The prior art discloses wafer boats for use in the manufacture and processing of semiconductor wafers. However, unlike the present invention, the prior art does not address nor overcome the disadvantages noted hereinabove. For example, in JP6124911, there is disclosed a horizontal wafer boat having a plurality of slots wherein a plurality of wafers are mounted. Each slot of the wafer boat, however, comprises a plurality of what appear as stabilizing or support members referred to as "wafer falling-down preventing members" which are provided with grooves to prevent the wafers from falling. This wafer boat also comprises flat supporting parts to support the weight of the wafer with its flat portion positioned in the slot. The wafer falling-down preventing members and the flat supporting parts, however are disadvantageous to the wafer positioned in the slot since the plurality of wafer falling-down preventing members and the flat supporting members contribute to wafer stress and wafer slip. Additionally, the boat described in JP6124911 is constructed to accommodate wafers with a flat portion positioned in the slot. This positioning of the wafer in the slot with its flat portion being supported by the boat allows side-to-side movement of the wafer in the slot, such as during transfer of the boat to and from a furnace. This wafer motion places stress on the wafer, increases particle formation and thus lowers device yields.

Thus, a need exists for a wafer boat which eliminates the disadvantages of the prior art wafer boats.

SUMMARY OF THE INVENTION

The wafer boat of the present invention is configured to reduce the likelihood wafer slip when wafers are heated to processing temperatures in excess of about 1000° C. The inventive wafer boat includes two upper support guides to maintain the wafer in the vertical orientation, and a lower, supporting groove to support the weight of the wafer. The material of the boat is selected, and the groove is shaped, such that when the wafer and boat are subjected to wafer processing temperatures of about 1000° C. and above, the shape of the groove will substantially correspond to the shape of the wafer contacting the groove, thereby supporting the wafer across the entire arc over which the wafer is contacted by the groove.

DETAILED DESCRIPTION OF THE INVENTION

The present invention relates to a horizontal, silicon carbide wafer boat configured to reduce wafer slip. Several factors have been considered in the development of the wafer boat of the present invention. In particular, the present invention recognizes the following principles: a) silicon strength decreases significantly at temperatures above about 600° C. and dramatically at temperatures above about 900° C.; b) below about 720° C., silicon is brittle and will not form a slip plane; c) shear stress is the dominant stress which induces slip; and d) the total wafer stress must be below the slip generation stress threshold.

Figure 1:
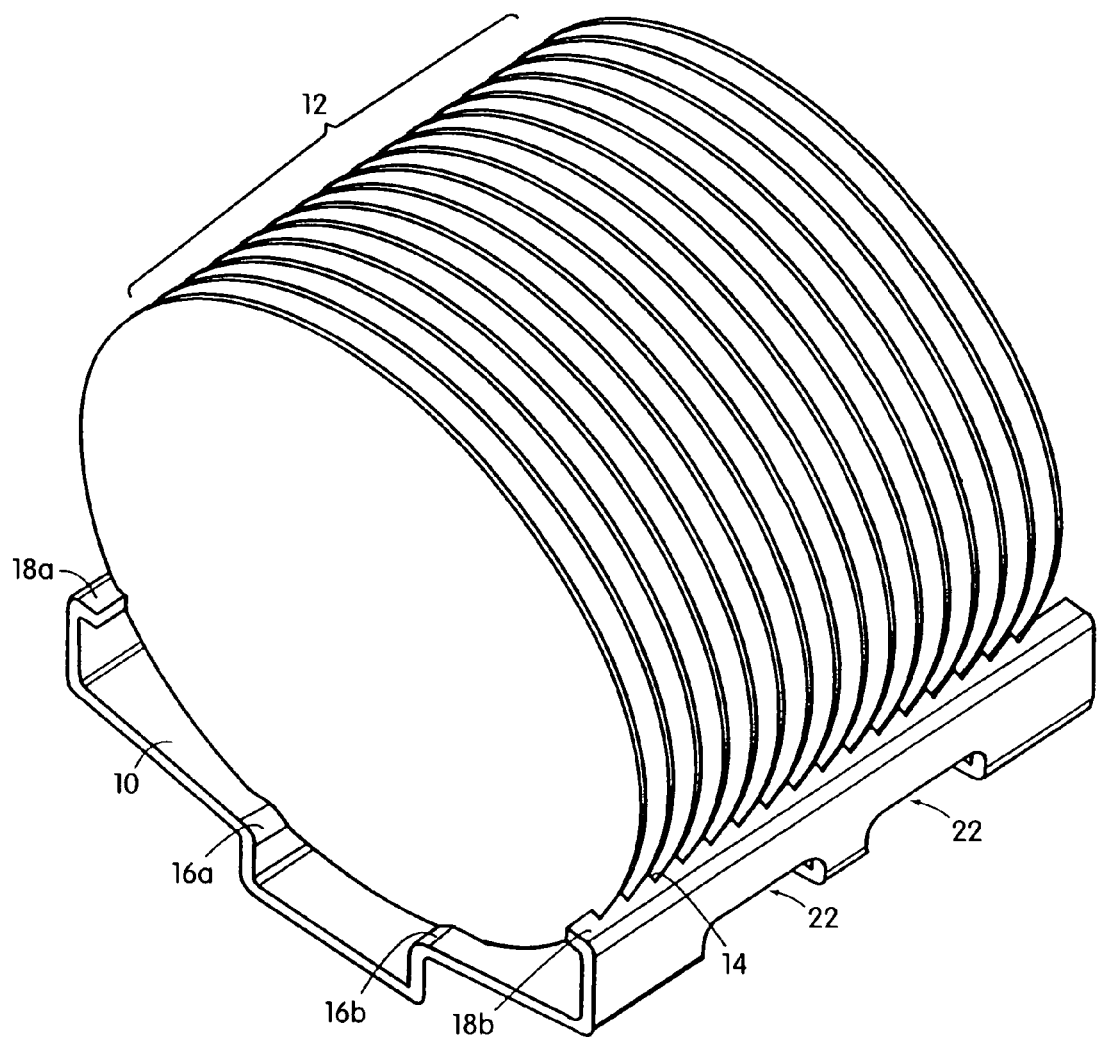
FIG. 1 is a schematic representation of a horizontal wafer boat loaded with wafers.

Wafer mechanical stress may arise from three sources—gravity, wafer pinching, and wafer-boat frictional forces. Wafer pinching and wafer-boat frictional forces are the result of differences between the boat and wafer thermal expansion. All of these forces are directly related to the wafer boat design. As shown in FIG. 1, in a prior art horizontal wafer boat 10, the wafers 12 are positioned in parallel, essentially vertical planes. Each wafer 12, which is generally circular in shape, is offset from each other at a constant spacing. The wafers 12 are disposed in the wafer boat 10 at a predetermined pitch to prevent them from tipping. Due to handling and thermal concerns larger wafers require longer pitches. For wafer diameter up to 150 mm, the optimal pitch is 2.38125 mm, and for wafer diameter up to 200 mm, the optimal pitch is 4.7625 mm.

In the horizontal wafer boat 10 shown in FIG. 1, the wafer 12 fits into precision machined slots 14. The wafers 12 are supported by bottom support members 16a, 16b and guided by upper support members 18a, 18b. The slots 14 prevent the wafer from tipping and contacting other wafers or becoming significantly out of the vertical plane. The gravity reaction force at each support has been found to be equal to one half of the wafer weight. Consequently, the normal force at each support can be expressed as:

$$F_{normal} = 0.5 \text{ (wafer weight)}/\cos(\alpha)$$

Thus, the cosine of the angle, α, is inversely proportional to the wafer stress.

Another component of mechanical stress to analyze is wafer pinching. Wafer pinching occurs when the wafer is constrained by the wafer slot when it is thermally expanding. As the wafer load is inserted into the furnace and processed, the wafers and the silicon carbide boat do not expand at the same rate primarily due to the much greater mass of the boat. The wafers heat up much more quickly and therefore expand outwardly. Thus, the boat must provide adequate space to allow for the thermal expansion difference between the wafer and the boat. The upper slots need to be designed with sufficient space to allow for this expansion. In addition, as the upper slots are positioned higher in relation to the center of the wafer, more allowance must be given for wafer expansion. This wafer allowance is a function of both the length of the chord formed by the upper slots and the height of the upper slots. As such, an allowance for wafer expansion must be provided with regard to the upper slots and must increase as the height of the slots increases.

As noted above, because of its lower mass, the wafer is more thermally responsive than the boat, causing the wafer to expand and contract at a different rate than the boat. This mismatch in expansion means that the wafer must slide over the surface of the lower slots. As the wafer slides over the support, static friction must be overcome to allow the wafer to move. The static friction creates tangential forces on the wafer. The friction force is a function of the normal force on the wafer at the support points:

$$F_{static\ friction} = \mu F_{normal}$$

Substituting this relationship for the normal force yields:

$$F_{static\ friction} = \mu 0.5\ (\text{wafer weight})/\cosine\ \alpha$$

The force needed to overcome static friction will also be affected by the surface roughness and shape of the lower slot. The surface roughness is relatively easy to control by good machining practices. A surface roughness of 1 to 2 micron Ra is achievable and has proven successful. The shape of the lower slot should not be a sharp point that could dig into the wafer and not allow smooth movement.

An additional property can be determined from the relationships above. To reduce friction effects, the wafer support angle should be minimized, the slot surface should be machined to less than 2 micron Ra, and the supports should approximate a tangent or be continuous to the wafer.

An analysis of the heat transfer from the furnace to the wafers has demonstrated that radiation will be the dominant contributor to heat transfer at high temperatures. In other words, wafer areas that are exposed to radiation will heat up quickly.

In radiative heat transfer, there are source(s), target(s), and blocker(s). A source is defined as a mass at higher temperature which gives off radiation. The target is defined as the mass which is being analyzed for heat transfer. The blocker is defined as a mass which interrupts the line of sight between a source and target.

Between the source and target surfaces, a geometric relationship called the radiation view factor exists. The radiation view factor defines how much of the radiant energy leaving the source actually hits the target entity. Because of complex geometries including curved shapes, 100% of the target entity is not directly visible to 100% of the source entity. Since there is not always a direct line of sight, not all of the radiation energy is received by the target.

In a horizontal furnace system, the furnace tube is the source and the wafers act as the targets as well as the blockers. As the load heats up, the wafers also act as sources to each other and heat is transmitted from wafer face to wafer face bi-directionally through the wafer load. From an understanding of the different modes of heat transfer to the wafers, it becomes possible to define additional characteristics of the inventive wafer boat. The boat should maximize the line of sight between the wafer faces and the furnace tube. Additionally, the boat design should not have a large thermal mass which will significantly lag behind the wafers thermally.

Wafer boats of the present invention are manufactured using slip casting techniques and green machining. From the green state, the boats are furnaced and then subjected to a final machining step. Prior manufacturing experience has shown that thin walled boats do not have a high rate of survival in this process. Also boats which have windows or cutouts close to the edge of the boat are prone to mechanical damage during manufacturing and in subsequent use.

Considering the above effects, the boat wall nominal thickness should be no less than about 5 mm. Likewise, windows should be positioned a minimum of about 10 mm from the boat ends or any sharp transitions.

Figure 2:
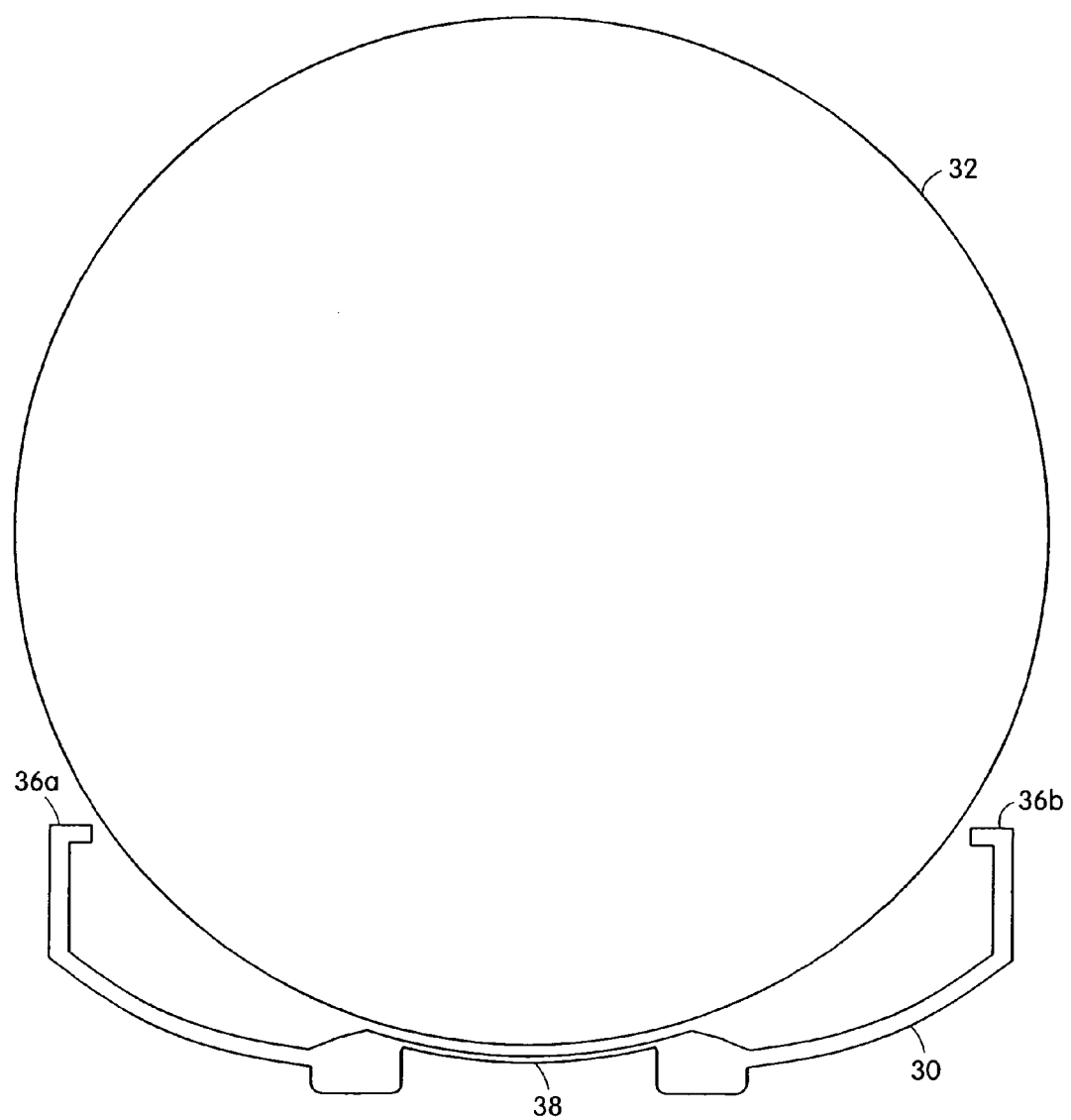
FIG. 2 is a schematic representation of a wafer boat of the present invention viewed from one end.
Figure 3:
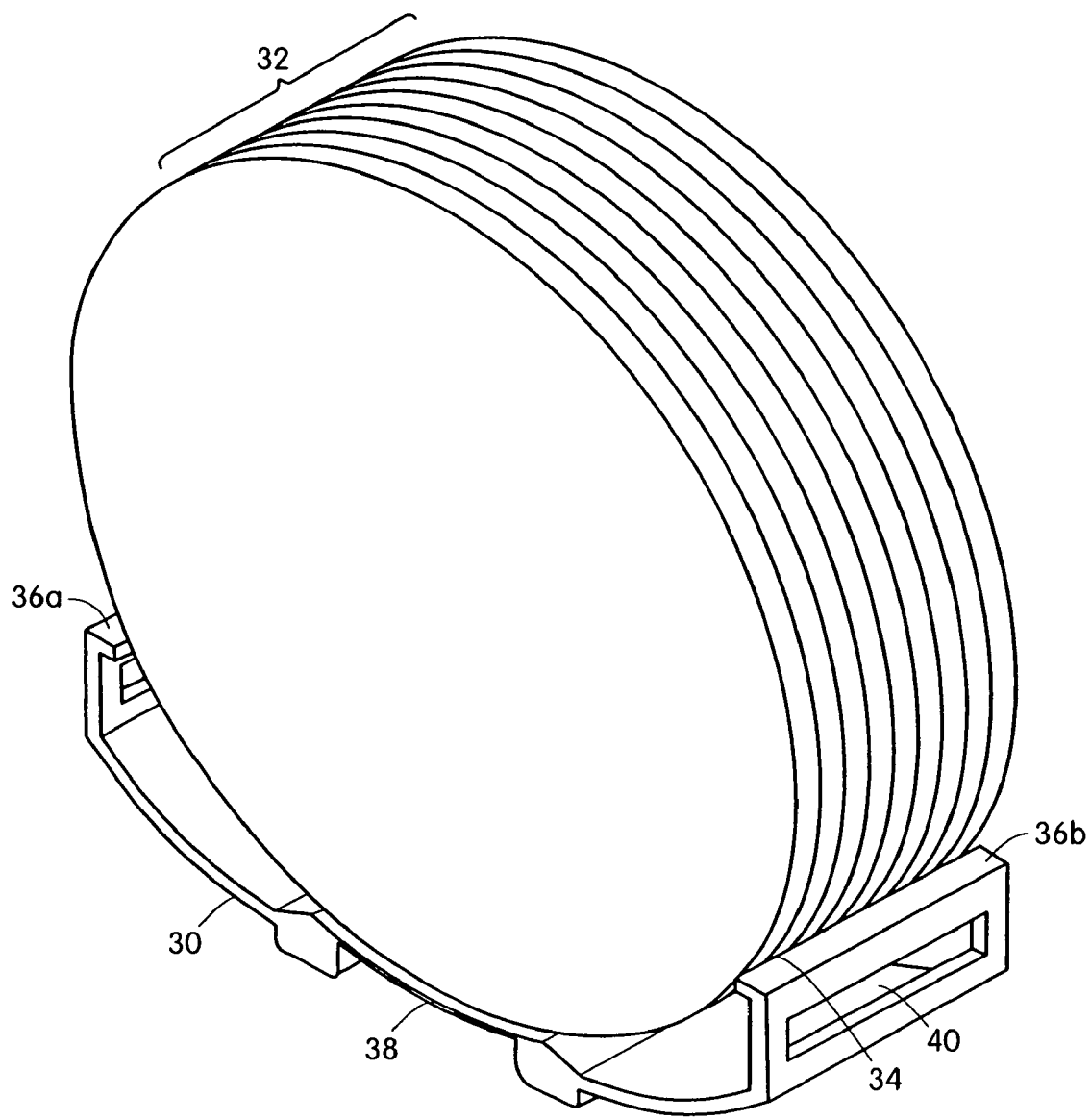
FIG. 3 is a schematic representation of a wafer boat of the present invention viewed at an oblique angle from above.

Taking the several considerations outlined above into account, the inventive wafer boat was developed. FIGS. 2 and 3 are schematic representations of one embodiment of the wafer boat 30 in accordance with the present invention, as viewed from different angles. In particular, unlike current wafer boats which provide support for each wafer at four points (two lower points to support the weight of the wafer, and two upper points to maintain the wafer in the vertical orientation as illustrated in FIG. 1), the wafer boat of the present invention is provided with two upper support guides 36a, 36b to maintain the wafer 32 in the vertical orientation, and a single lower supporting grooved portion 38 to support the weight of the wafer 32. Once the material of which wafer boat 30 is fabricated is selected, the supporting grooved portion 38 which is in a plane lower than the upper support guides 36a, 36b, is shaped having an arcuate configuration such that, when the wafer 32 and wafer boat 30 are subjected to wafer processing temperatures of about 1000° C. and above, the shape of the supporting grooved portion 38 will substantially correspond to the shape of the part of the wafer 32 contacting the supporting grooved portion 38, thereby supporting the wafer 32 across the entire arcuate portion of a circular wafer's periphery which is in contact with the supporting grooved portion. In other words, the lower arcuate periphery of the circular wafer rests upon and is supported by the supporting grooved portion 38 when the wafer 32 is positioned in a slot 34 in wafer boat 30 and maintained in a vertical position by the upper support guides 36a, 36b. The wafer boat 30 having this configuration provides exceptional support for and stabilization of the wafers 32 positioned in the slots 34. Additionally, the wafer boat 30 of the present invention includes one or more large openings or windows 40 between each end of the boat in order to increase the radiation view factors and decrease radiation blocking caused by the boat, as compared to boats currently known in the art.

Since they are formed of different materials, the wafer 32 and the wafer boat 30 have different thermal expansion coefficients. In one embodiment, the wafer boats of the present invention are formed of SiC. One preferred SiC comprises recrystallized SiC commercially available from Saint-Gobain Industrial Ceramics Inc., of Worcester, Mass. under the tradename CRYSTAR®. Such materials can comprise either recrystallized SiC or silicon impregnated SiC where semiconductor grade silicon has been used to fill porosity in the body. The silicon impregnated material can be further provided with a layer of CVD-SiC to seal the surface and prevent silicon migration during use of the device in wafer processing.

Recrystallized SiC, either impregnated or not, is preferred for wafer boats as a result of its strength at high temperatures. Specifically, CRYSTAR® material has been found to be significantly stronger and more dimensionally stable than quartz throughout the semiconductor processing temperature range. As a result, the material can be used to fabricate wafer boats that resist thermal distortion or sagging during their working lifetimes.

Figure 5:
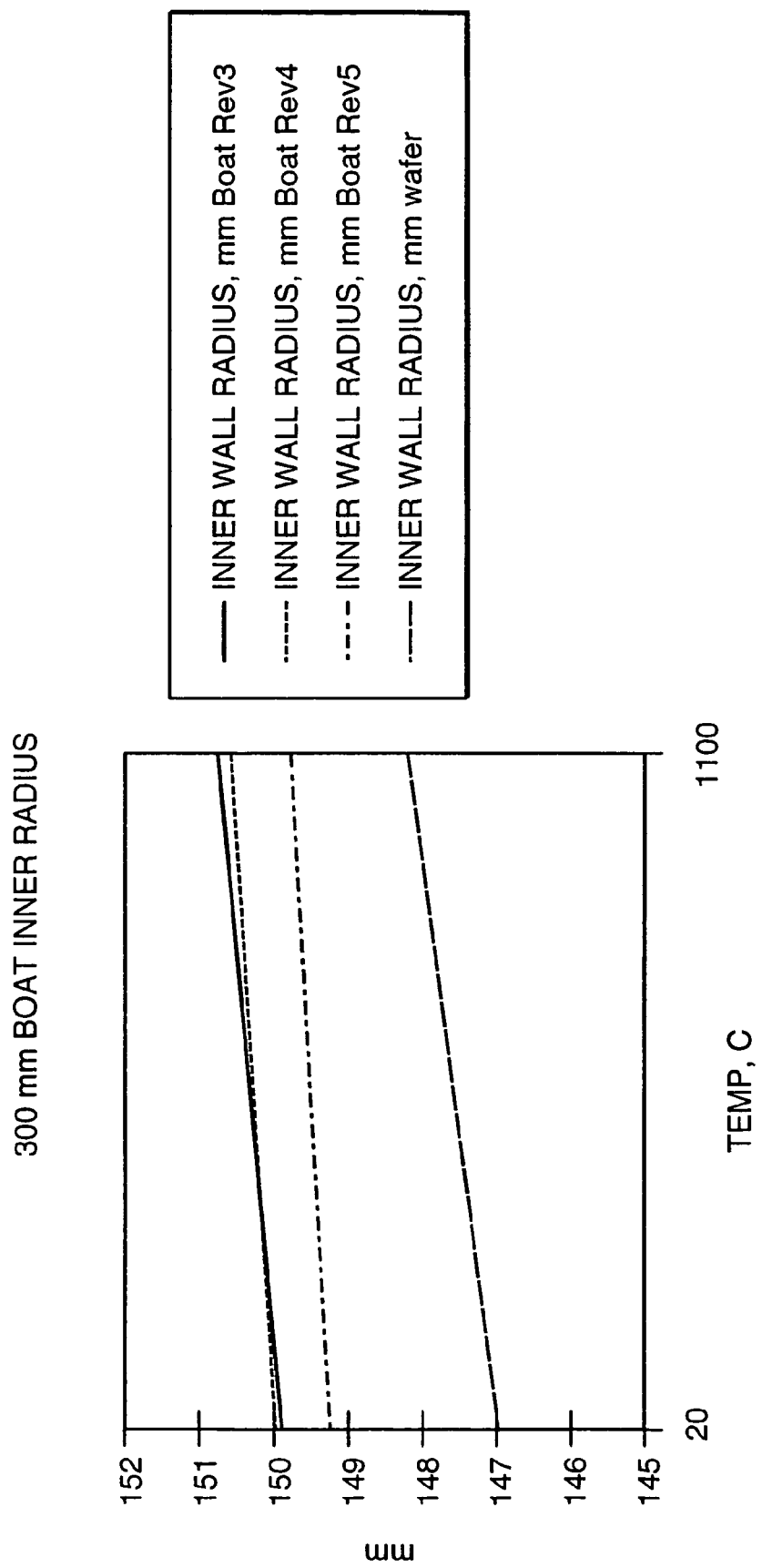
FIG. 5 plots the radius of the inventive boat and the radius of the wafer as a function of temperature.

Boats formed from recrystallized silicon carbide (i.e., CRYSTAR® material) have been found to exhibit a thermal expansion coefficient that is about 27% higher than that of polysilicon wafers. FIG. 5 shows the radius of the inventive boat and the wafer as a function of temperature. In effect, the CRYSTAR® recrystallized silicon carbide acts as a "smart" material, a material which transforms energy from one form to another in order to effect a desired state, and which changes one of its properties—chemical, mechanical, optical, magnetic or thermal—in response to a change in the conditions in its environment.

Boats intended for use with 300 mm wafers will most likely be moved using automated equipment which contacts the underside of the boat. Based on this type of boat transfer, the design was analyzed to determine stress due to loading. The total possible wafer capacity of the boat was defined as 25 wafers, (approximately 3.38 kg). A safety factor of ten was chosen. Although this factor of safety is high, experience has shown that wafer boats are often exposed to severe handling. The brittle nature of ceramic materials and the interface of the boats with automation and rigid fixturing require a high safety factor.

As noted previously, the wafer boats of the present invention are intended to be used with 300 mm wafers. Of course, the present invention is not intended to be limited strictly to wafers of this size. Rather, the inventive wafer boats are intended to be used both with existing smaller wafer geometries, as well as with larger wafer geometries which may be developed.

Figure 4:
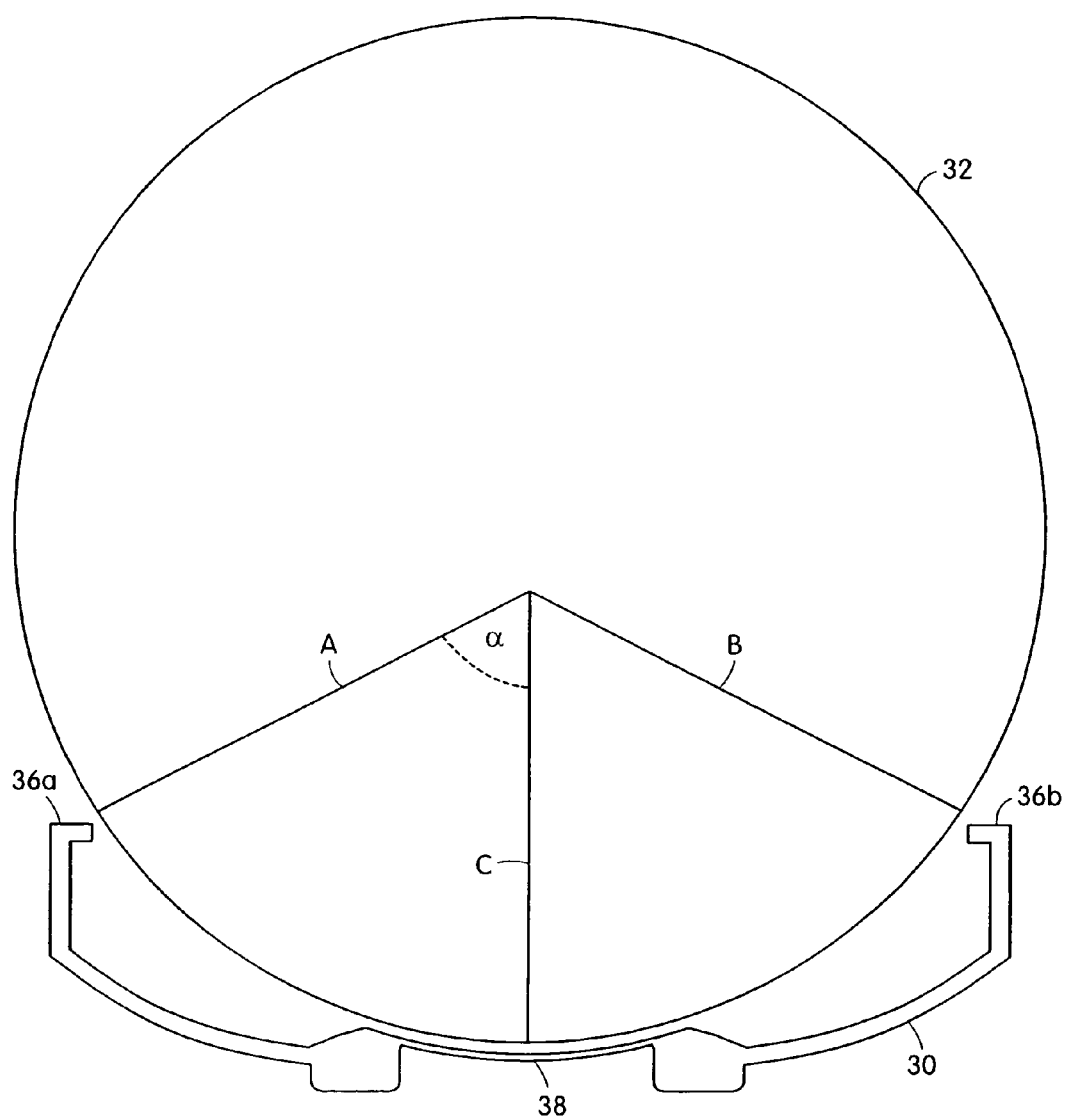
FIG. 4 diagrams the angle α for determining one relevant dimension of the inventive wafer boat.

In the case of a wafer boat for use with a 300 mm wafer, in one embodiment, the boat includes 10 slots intended to hold 10 wafers. Such a boat is approximately 11 cm long. The opposing upper supports are positioned approximately 6.8 cm above the lowest point of the groove, and spaced apart from one another by approximately 10.4 cm. Each slot will have a width of approximately 0.89 mm. The groove will have an arc length of approximately 20.82 mm. FIG. 4 depicts a triangle having a hypotenuse "A" defined as the wafer radius extending from the center of the wafer to the wafer periphery or edge at a point at which one of the upper support guides holds the wafer in the slot. An angle $\alpha$ defined between the hypotenuse "A" and a radius "B" originating at the center of the wafer and extending downward to a point on the wafer periphery which is positioned in the middle of the grooved portion on which the wafer rests. A third radius "C" extends from the center of the wafer to the periphery of the wafer to a point at which the second upper supporting guide holds the wafer in the slot. In the inventive wafer boat, the angle $\alpha$ is in the range of 10 degrees to 80 degrees, and optimally about 37 degrees. The total angle defined between radius A and radius C is approximately 74 degrees.

It should be understood that each of the dimensions provided above is given at room temperature and is intended for wafer boats formed of CRYSTAR® recrystallized SiC. The dimensions may differ for boats formed of different materials based upon the thermal expansion coefficients of those materials. Likewise, the dimensions will be different at wafer processing temperatures of between approximately 1000° C.–1400° C.

EXPERIMENTAL

The wafer boat of the present invention was tested according to normal methods of usage and the following results were obtained:

150 wafers were tested. None displayed any slip lines.

1 wafer had very faint slip lines detectable using a Hologenix magic mirror.

2 wafers had scratches or very faint slip lines visible with the Hologenix magic mirror.

The results compare to 20% slip lines obtained using standard conti wafer boats.

EQUIVALENTS

From the foregoing detailed description of the specific embodiments of the invention, it should be apparent that a novel wafer boat has been described. Although particular embodiments have been disclosed herein in detail, this has been done by way of example for purposes of illustration only, and is not intended to be limiting with respect to the scope of the appended claims which follow. In particular, it is contemplated by the inventors that various substitutions, alterations, and modifications may be made to the invention without departing from the spirit and scope of the invention as defined by the claims.

What is claimed is:

1. A wafer boat combination comprising a wafer boat and a plurality of a semiconductor wafers, the wafer boat comprising:

a first end and a second end;

a plurality of slots positioned between the first and the second ends, the semiconductor wafers being respectively received in the plurality of slots, each of the plurality of slots comprising first and second upper support guides to maintain the semiconductor wafers in a vertical orientation; and a lower grooved portion for supporting a plurality of wafers, the wafer boat having an inner radius originating from a centerpoint, the slots extending generally along an arc having a radius of curvature corresponding to the inner radius, wherein the lower grooved portion has a generally arcuate and concave contour as viewed from the centerpoint, and wherein at semiconductor processing temperatures of between approximately 1000° C. to 1400° C., the lower grooved portion substantially conforms to the portion of the wafer supported thereon.

2. The wafer boat combination of claim 1, wherein the wafer boat comprises silicon carbide.

3. The wafer boat combination of claim 2, wherein the silicon carbide is recrystallized silicon carbide.

4. The wafer boat combination of claim 1, wherein semiconductor wafers have a diameter of about 300 mm.

5. The wafer boat combination of claim 1, wherein an angle $\alpha$ in the range of 10–80 degrees is defined between (i) a first radius of a wafer of the plurality of wafers extending from the center of said wafer to the periphery of said wafer proximate the first upper guides, and (ii) a second radius extending vertically downward from the center of said wafer to a point on the periphery of the wafer which corresponds to the center of the lower portion.

6. The wafer boat combination of claim 5, wherein the angle $\alpha$ is approximately 37 degrees.

7. The wafer boat combination of claim 1, wherein the plurality of slots between the first and second ends of said boat are configured to support up to 25 semiconductor wafers.

8. The wafer boat combination of claim 1, wherein the wafer boat has a thickness of not less than 5 mm.

9. The wafer boat combination of claim 1, wherein the plurality of slots are spaced apart from each other at a constant spacing, such that the plurality of wafers are spaced apart from each other at said constant spacing.

* * * * *